United States Patent
Tadigadapa et al.

(10) Patent No.: US 9,966,232 B2
(45) Date of Patent: May 8, 2018

(54) ULTRA-HIGH SPEED ANISOTROPIC REACTIVE ION ETCHING

(71) Applicant: THE PENN STATE RESEARCH FOUNDATION, University Park, PA (US)

(72) Inventors: Srinivas Tadigadapa, State College, PA (US); Gokhan Hatipoglu, State College, PA (US)

(73) Assignee: The Penn State Research Foundation, University Park, PA (US)

(*) Notice: Subject to any disclaimer, the term of this patent is extended or adjusted under 35 U.S.C. 154(b) by 0 days. days.

(21) Appl. No.: 14/964,023

(22) Filed: Dec. 9, 2015

(65) Prior Publication Data
US 2016/0099132 A1   Apr. 7, 2016

Related U.S. Application Data

(62) Division of application No. 14/053,066, filed on Oct. 14, 2013.
(Continued)

(51) Int. Cl.
*H01L 21/302* (2006.01)
*H01J 37/32* (2006.01)
(Continued)

(52) U.S. Cl.
CPC .... *H01J 37/32357* (2013.01); *B81C 99/0025* (2013.01); *C03C 15/00* (2013.01);
(Continued)

(58) Field of Classification Search
CPC ............... H01L 21/306; H01L 21/308; H01L 21/31116; H01L 21/31138; H01L 21/302;
(Continued)

(56) References Cited

U.S. PATENT DOCUMENTS 4,283,249 A   8/1981   Ephrath
4,654,112 A   3/1987   Douglas et al.
(Continued)

FOREIGN PATENT DOCUMENTS

RU   2022053   10/1994
RU   2094960   10/1997
(Continued)

OTHER PUBLICATIONS

Adegoboyega et al., "Deep level transient spectroscopy study of the damage induced in n-type silicon by a gate oxide etching in a CHF3/Ar plasma", Journal of Vacuum Science & Technology B (1997) 15: 623-628.
(Continued)

*Primary Examiner* — Lan Vinh
(74) *Attorney, Agent, or Firm* — Dinsmore & Shohl LLP

(57) ABSTRACT

A system and method for reactive ion etching (RIE) system of a material is provided. The system includes a plasma chamber comprising a plasma source and a gas inlet, a diffusion chamber comprising a substrate holder for supporting a substrate with a surface comprising the material and a gas diffuser, and a source of a processing gas coupled to the gas diffuser. In the system and method, at least one radical of the processing gas is reactive with the material to perform etching of the material, the gas diffuser is configured to introduce the processing gas into the processing region, and the substrate holder comprises an electrode that can be selectively biased to draw ions generated by the plasma source into the processing region to interact with the at least one processing gas to generate the at least one radical at the surface.

32 Claims, 9 Drawing Sheets

Related U.S. Application Data

(60) Provisional application No. 61/737,282, filed on Dec. 14, 2012.

(51) Int. Cl.
| | |
|---|---|
| *B81C 99/00* | (2010.01) |
| *H01L 21/3065* | (2006.01) |
| *H01L 21/311* | (2006.01) |
| *C03C 15/00* | (2006.01) |

(52) U.S. Cl.
CPC .... *H01J 37/3244* (2013.01); *H01J 37/32449* (2013.01); *H01J 37/32715* (2013.01); *H01L 21/3065* (2013.01); *H01L 21/31116* (2013.01); *H01J 2237/3341* (2013.01); *H01J 2237/3345* (2013.01)

(58) Field of Classification Search
CPC .......... H01L 21/3111; H01L 21/31114; H01L 21/3065; H01L 21/02315
USPC ....... 438/706, 710, 712, 714, 717, 719, 720, 438/725; 216/67
See application file for complete search history.

(56) References Cited

U.S. PATENT DOCUMENTS

| | | | | |
|---|---|---|---|---|
| 4,950,376 | A * | 8/1990 | Hayashi | C23C 16/511 156/345.41 |
| 5,413,670 | A | 5/1995 | Langan et al. | |
| 6,063,300 | A | 5/2000 | Suzuki et al. | |
| 6,074,518 | A | 6/2000 | Imafuku et al. | |
| 6,541,164 | B1 * | 4/2003 | Kumar | H01L 21/0276 257/E21.029 |
| 6,642,143 | B2 | 11/2003 | Yamane | |
| 6,645,870 | B2 | 11/2003 | Negishi et al. | |
| 7,300,881 | B2 | 11/2007 | Kato et al. | |
| 7,371,688 | B2 | 5/2008 | Ji et al. | |
| 8,043,434 | B2 * | 10/2011 | Chebi | G03F 7/427 134/1 |
| 9,184,028 | B2 * | 11/2015 | Dhindsa | H01J 37/32091 |
| 2005/0093460 | A1 * | 5/2005 | Kim | H01J 37/321 315/111.21 |
| 2005/0241671 | A1 | 11/2005 | Dong et al. | |
| 2006/0032833 | A1 | 2/2006 | Kawaguchi et al. | |
| 2006/0177600 | A1 | 8/2006 | Lu et al. | |
| 2007/0037397 | A1 | 2/2007 | Lu et al. | |
| 2008/0289576 | A1 | 11/2008 | Lee et al. | |
| 2009/0215251 | A1 | 8/2009 | Vellaikal et al. | |
| 2009/0301939 | A1 | 12/2009 | Sorensen | |
| 2010/0022095 | A1 | 1/2010 | Wu et al. | |
| 2010/0099263 | A1 | 4/2010 | Kao et al. | |
| 2011/0209985 | A1 | 9/2011 | Youming et al. | |
| 2012/0091098 | A1 * | 4/2012 | Dinev | H01J 37/3211 216/68 |
| 2012/0238102 | A1 * | 9/2012 | Zhang | H01J 37/32422 438/718 |
| 2013/0102155 | A1 * | 4/2013 | Gang | H05H 1/30 438/710 |
| 2013/0319615 | A1 | 12/2013 | Cho et al. | |

FOREIGN PATENT DOCUMENTS

| | | |
|---|---|---|
| RU | 2187168 | 8/2002 |
| RU | 2293796 | 2/2007 |
| RU | 2374358 | 11/2009 |

OTHER PUBLICATIONS

Bell et al., "Investigation of selective SiO/sub 2/-to-Si etching in an inductively coupled high-density plasma using fluorocarbon gases", Journal of Vacuum Science & Technology A (Vacuum, Surfaces, and Films) (1994) 12: 3095-3101.

Choi et al., "Fabrication of a double aperture for near-field optical trapping", Journal of the Korean Physical Society (2004) 45: 1500-1504.

Cliteur et al., "Fundamental study of the effect of SF/sub 6/ and N/sub 2/ inclusion on Ar inductively coupled plasma", Transactions of the Institute of Electrical Engineers of Japan, Part A (1999) 119-A: 482-489.

Cruden et al., "Detection of chamber conditioning by CF/sub 4/ plasmas in an inductively coupled plasma reactor", Journal of Vacuum Science & Technology B (Microelectronics and Nanometer Structures) (2002) 20: 353-361.

Goyal et al., "High speed anisotropic etching of Pyrex for microsystems applications", Journal of Non-Crystalline Solids (2006) 352: 657.

Goyal et al., "High-speed anisotropic etching of quartz using SF6/C4F8/Ar/O2 based chemistry in inductively coupled plasma reactive ion etching system", Proc SPIE (2006) 6111: 61110P.

Hein et al., "Self-masking controlled by metallic seed layer during glass dry-etching for optically scattering surfaces", Journal of Applied Physics (2010) 107(3): 033301. (6 pages).

Hynes et al., "Recent advances in silicon etching for MEMS using the ASE™ process", Sensors and Actuators A: Physical (1999) 74(1-3): 13.

Ichiki et al., "Plasma applications for biochip technology", Thin Solid Films (2003) 435(1): 62.

Karecki et al., "Evaluation of oxalyl fluoride for a dielectric etch application in an inductively coupled plasma etch tool", Journal of the Electrochemical Society (2001) 148: 141-9.

Li et al. "Deep reactive ion etching of Pyrex glass", Proceedings of IEEE Thirteenth Annual International Conference on Micro Electro Mechanical Systems (2000): 271-276.

Li et al. "Deep reactive ion etching of Pyrex glass using SF6 plasma", Sensors and Actuators a-Physical (2001) 87: 139-145.

Li et al. "Smooth surface glass etching by deep reactive ion etching with SF6 and Xe gases", Journal of Vacuum Science & Technology B (Microelectronics and Nanometer Structures) (2003) 21: 2545.

Lin et al., "A fast prototyping process for fabrication of microfluidic systems on soda-lime glass", Journal of Micromechanics and Microengineering (2001) 11: 726-732.

Metwalli et al., "Reactive ion etching of glasses: Composition dependence", Nuclear Instruments and Methods in Physics Research Section B: Beam Interactions with Materials and Atoms (2003) 207(1): 21-27.

Nagy, "Vertical oxide etching without inducing change in critical dimensions", Optical Engineering (1992) 31: 335-340.

Ok et al., "High density, high aspect ratio through-wafer electrical interconnect vias for MEMS packaging", IEEE Transactions on Advanced Packaging (2003) 26: 302-309.

Pisani et al., "Bulk acoustic wave resonators for infrared detection applications", Solid-State Sensors, Actuators and Microsystems Conference (2009): 1959-1962.

Queste et al., "Manufacture of microfluidic glass chips by deep plasma etching, femtosecond laser ablation, and anodic bonding", Microsystems Technology (2010) 16: 1485-1493.

Rabe et al., "Monolithic miniaturized quartz microbalance array and its application to chemical sensor systems for liquids", IEEE Sensors Journal (2003) 3: 361.

Sugai et al., "Diagnostics and control of radicals in an inductively coupled etching reactor", Journal of Vacuum Science & Technology A: Vacuum, Surfaces, and Films (1995) 13(3): 887.

Yamakawa et al., "Ultrahigh-speed etching of SiO2 with ultrahigh selectivity over Si in microwave-excited non equilibrium atmospheric pressure plasma", Applied Physics Letters (2004) 85: 549-551.

Yang et al., "Resist and oxide thickness effect on process window for 0.2 mu m contact patterns with off-axis illumination and attenuated phase-shift mask", Proceedings of the SPIE—The International Society for Optical Engineering Optical Microlithography XI (1998): 3334: 553-558.

Zeze et al., "Reactive ion etching of quartz and Pyrex for microelectronic applications", Journal of Applied Physics (2002) 92(7): 3624-3629.

(56) References Cited

OTHER PUBLICATIONS

Zimmerman et al., "Electrical characterisation of high-frequency thickness-shear-mode resonators by impedance analysis", Sensors and Actuators B—Chemical (2001) 76: 47-57.

\* cited by examiner

ULTRA-HIGH SPEED ANISOTROPIC REACTIVE ION ETCHING

CROSS-REFERENCE TO RELATED APPLICATIONS

This application is a Divisional Application of U.S. patent application Ser. No. 14/053,066, filed on Oct. 14, 2013, which claims the priority to and the benefit of U.S. Provisional Patent Application No. 61/737,282, entitled "ULTRA-HIGH SPEED ANISOTROPIC REACTIVE ION ETCHING" and filed Dec. 14, 2012, the contents of which are herein incorporated by reference in their entireties.

FIELD OF THE INVENTION

The present invention relates to reactive ion etching (RIE), and more specifically to apparatus and methods for ultra-high speed anisotropic RIE.

BACKGROUND

Silicon dioxide in its crystalline form (quartz) as well as its amorphous form (glass) is finding increasing applications in microsystems, as active resonator structure as well as passive support and packaging components. Recently borosilicate glass and quartz substrates have been etched with high aspect ratios and high surface smoothness using SF6 and Ar/Xe gases [1-3]. The main focus of these etch process development has been the achievement of high etch rates and high aspect ratio etching of silica. In this context the processes developed thus far rely upon ion bombardment to accelerate the etching process while fluorine based gases are used to provide the reactive component for etching. The use of heavier Xe helps reduce the re-deposition and more effectively removes any non-volatile residues resulting in smoother surfaces with an average surface roughness of ~2 nm.

In spite of more than an order of magnitude increase in the etch rate of silicon dioxide compared to comparable processes used in CMOS industry, the currently obtained etch rates are not attractive enough for MEMS through wafer and high aspect ratio etching of glass substrates. Considering that typical glass substrates are 100-500 µm, these etches can take between 200 (~3 hours) and 1000 minutes (~16 hours) at a rate of ~0.5 µm/min making such processes impractical for glass based device development and their commercialization. Etch processes that can potentially break through this etch rate limitation for glass can dramatically affect several MEMS devices—including inertial and microfluidic devices. Thus, the question to ask is what is limiting the etch rate of silica at just under the 1 µm/min.

To date, efforts in silicon dioxide (glass) etching, have been primarily directed towards realizing features for microelectronics applications such as interconnect vias [5], waveguides [6], phase shift masks [7], etc. Hence, process optimization has traditionally aimed at increasing the selectivity of silicon dioxide over silicon substrate [8], reducing gate oxide damage [9], decreasing sidewall roughness [10], and increasing sidewall angle of the etched features [11]. With the advent of microelectromechanical systems (MEMS) and microsystems in the last decade, focus has shifted to high aspect ratio etching of silicon dioxide for applications in microfluidics [12], microsensors [13], and lab-on-a-chip applications. Many of these applications require greater than 100 µm of silicon dioxide (glass) etching while maintaining the surface finish, with RMS surface roughness of less than 5 nm [14, 15]. Hence, these applications impose additional new requirements on borosilicate glass etching processes such as high etch rate, high selectivity to masking material, high anisotropy, low surface roughness for mirror polish, uniformity of etch across the wafer and within a pattern [16], etc.

Traditional RIE processes are limited by the fact that the substrate power and RF plasma power are coupled to each other often resulting in etch non-uniformity across the wafer, low density of plasmas, and limited control over the processing conditions. However, in an inductively coupled plasma (ICP) RIE system, the substrate power and the coil (source) power are independent of each other thus providing excellent control over plasma density (controlled by ICP power) and energy of etchant ions (controlled by substrate power) [17]. As a result, plasma can be generated even at relatively low pressures in the range of $10^{-4}$ Torr to $10^{-3}$ Torr. However, at such low pressures, the plasma in traditional RIE systems is not stable.

Nonetheless, low processing pressure is advantageous for rapid removal of etching products from the surface and also for the removal of stray particles generated from the masking material, substrate holder and walls of the reaction chamber. The presence of stray particles results in micro-masking wherein the micro-particles or reaction products on the substrate shield the surface from the etchant species resulting in surface roughness, micro-trenching and formation of plateau-like structures. Additionally, the increased mean free path at low pressures improves the anisotropy of the etch by minimizing the randomizing collisions between the radicals, ions and other plasma species. Borosilicate glass substrates are known to have a typical composition of $SiO_2$ (79.6%), $B_2O_3$ (12.5%), $Na_2O$ (3.72%), $Al_2O_3$ (2.4%), and $K_2O$ (0.02%).

In the case of deep reactive ion etching of silicon dioxide (quartz or borosilicate glass) a high Ar to $SF_6$ ratio is required to maintain low RMS surface roughness. FIG. 1 shows the dependence of the etch rate and RMS surface roughness as a function of substrate RF power, chamber pressure, Ar, and $SF_6$ flow rate. In all cases the pressure in the chamber was maintained at 0.26 Pa throughout the flow ranges. The ICP source power was 2000 W and a substrate bias power of 475 W (Bias Voltage of 80 V) was used in generating these results. From the graphs it can be seen that the best surface roughness of ~2 nm is obtained at high Ar flow rates, low chamber pressure, and high substrate power—corresponding to conditions dominated by physical sputtering of the material. The etch rate can be increased by increasing the $SF_6$ flow rate from 5 sccm to 50 sccm from 0.54 µm/min to 0.74 µm/min however the surface roughness was found to degrade under these conditions to >100 nm. Pulse electroplated nickel is typically used as the etch mask layer and a selectivity of ~25:1 can be obtained for $SiO_2$ etching under these conditions. FIG. 1(e) shows an SEM of a high aspect ratio feature etched in quartz using these conditions. Similar results were obtained by Li et al. while etching $SiO_2$ using Xe instead of Ar. The higher sputter yield of Xe gave a lower RMS surface roughness value as compared to Ar for the same mole fraction of the inert gas in $SF_6$. Although silicon grease or a small drop of a fluoropolymer based oil, such as FOMBLIN manufactured by Solvay S.A. of Belgium, Brussels, can be used for mounting the quartz/glass substrates onto a 4" silicon carrier wafer, these materials cannot withstand the long process times and can leave the backside of the sample with hard to remove, stubborn residues. Furthermore, these mounting materials do not provide a reliable and uniform thermal contact, between the carrier wafer and the sample, throughout the entire etch process. In order to avoid these problems, indium solder can be used for mounting the sample directly onto a silicon wafer. However, the mounting side of the $SiO_2$ sample needs to be coated with 20/80 nm of Cr/Au to provide a surface to which the solder can adhere. Of course if the sample is large enough it can be directly mechanically clamped or an electrostatic chuck can be used for the mounting of the sample. In all cases the backside of the chuck/substrate is cooled using helium gas maintained at the desired temperature.

SUMMARY

Embodiments of the invention concern systems and methods for RIE, and more specifically to apparatus and methods for ultra-high speed and ultra-high smooth anisotropic RIE of quartz and other glasses. In some embodiments, the apparatus and methods can be selected to provide etched glass surface with excellent smoothness.

In a first embodiment of the invention, a system for reactive ion etching (RIE) system of a material is provided. The system includes a plasma chamber comprising a plasma source and a gas inlet. The system also includes a diffusion chamber comprising a substrate holder for supporting a substrate with a surface comprising the material and a gas diffuser. The system further includes a source of at least one processing gas coupled to the gas diffuser. In the system, at least one radical of the at least one processing gas is reactive with the material to perform etching of the material. Further, the substrate holder is configured to support the substrate within a processing region of the diffusion chamber. Additionally, the gas diffuser is configured to introduce the at least one processing gas into the processing region and the substrate holder comprises an electrode that can be selectively biased to draw ions generated by the plasma source into the processing region to interact with the at least one processing gas to generate the at least one radical at the surface.

In a second embodiment of the invention, a method for reactive ion etching is provided. The method can include forming plasma at a first location and introducing at least one processing gas at a second location corresponding to a surface to be etched, wherein at least one radical of the at least one processing gas is reactive or enables reactivity with the surface to perform etching of the surface. The method can further include directing ions from the plasma to a substrate at second location to interact with the at least one processing gas to generate the at least one radical at the surface.

In the various embodiments, the forming of the plasma can include generating the plasma using an inductively coupled plasma source. Further, the introducing of the at least one processing gas can include configuring the gas diffuser to direct the at least one processing gas into the second location. In some configurations, the gas diffuser can be a diffuser ring. Alternatively, the gas diffuser can be a plurality of nozzles.

In the various embodiments, the forming of the upstream plasma can include generating the plasma using a magnetically enhanced plasma source or a helicon source, a capacitively coupled plasma source, or any other source of high density plasma. Alternatively, the forming of the upstream plasma can include generating the plasma using a non-high density source, such as a parallel plate capacitor plasma source, an inductively coupled plasma source, a microwave plasma source, an ionization chamber, or any other source of low to normal density plasma. Further, the introducing of the at least one processing gas can include configuring the gas diffuser to direct the at least one processing gas into the second location. In some configurations, the gas diffuser can be at least one diffuser ring. Alternatively, the gas diffuser can be a plurality of nozzles.

DETAILED DESCRIPTION

Figure 1:
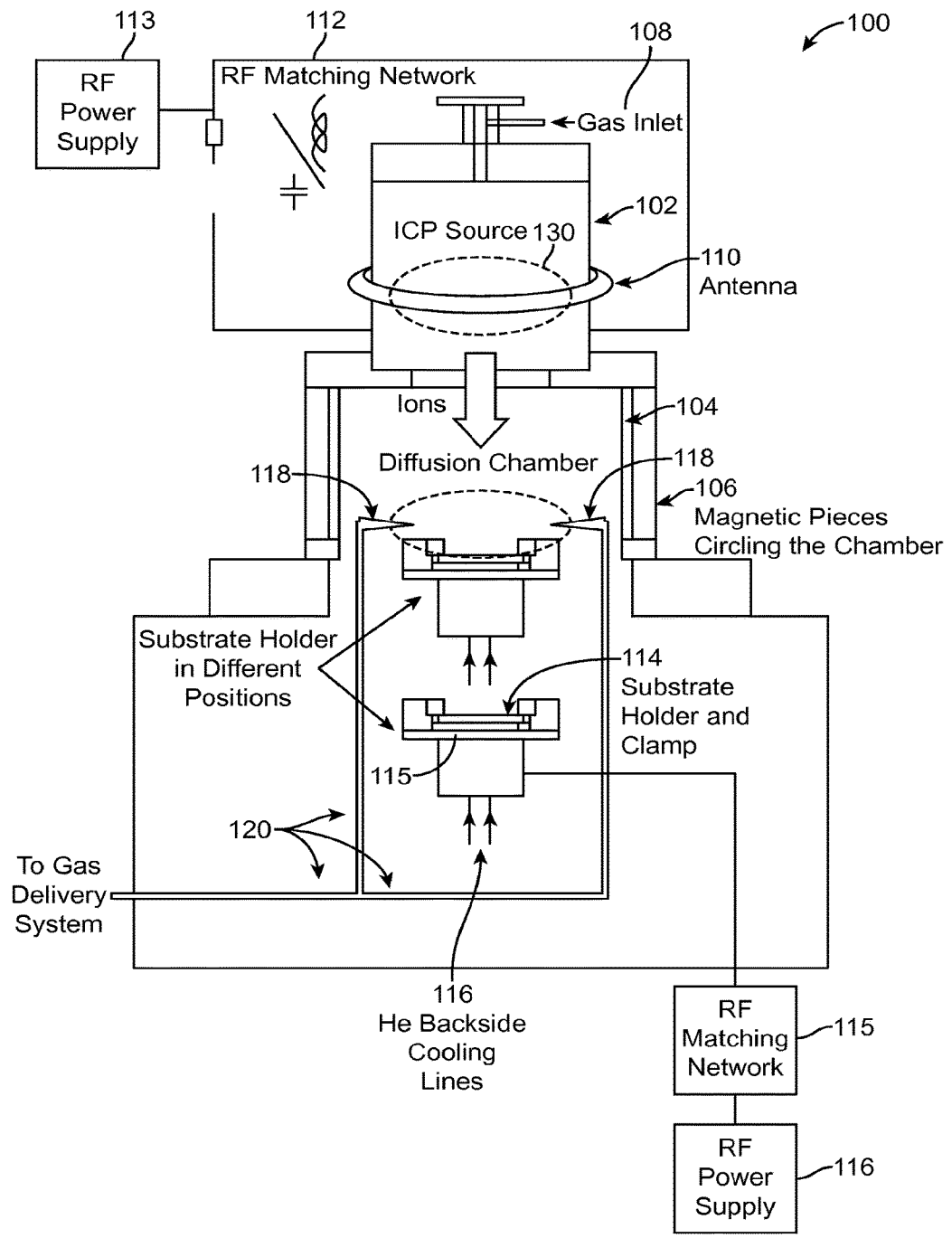
FIG. 1 is a schematic of a system in accordance with the various embodiments.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The various embodiments are directed to etch apparatus and methods that achieve glass high etch rates, at least in the 1-100 μm/min range, for glass substrates resulting in another order of magnitude improvement in the etch rate of glass.

In 2004, Yamakawa et al. [19] demonstrated a very high speed etching of silicon dioxide (BPSG) film using microwave excited non-equilibrium atmospheric pressure plasma. The authors were able to demonstrate an ultra-high etch rate of $SiO_2$ (14 μm/min) and an unprecedented selectivity of 200 with respect to silicon using $NF_3$/He along with addition of $H_2O$ as the etching gas. In this configuration, the inventors note that the fast etch rate can be attributed to the presence of $NF_x$ radicals arising from the breakup of $NF_3$ into $NF_x^*$+ $F^*$–radicals. $NF_x$–radicals (with x>0). These radicals are extremely aggressive towards $SiO_2$ and other dielectrics (and polymers) and can etch them at extremely high speed. The addition of water vapor ($H_2O$) consumes the fluorine radicals by HF formation ($2F^*+H_2O \rightarrow 2HF+<O>$) whereas $NF_x$ radicals are much less scavenged. Accordingly, water vapor therefore acts as a selective fluorine radical scavenger and consequently reduces any undesirable attack of silicon. However, if $NF_3$ is completely broken down, e.g., as in high-density, high power plasma, then the plasma primarily consists only of fluorine and nitrogen radicals. Under these conditions, a complete quenching of the fast etch rate of $SiO_2$ and other dielectrics has been observed. The complete breakup of $NF_3$ molecules under appropriate plasma conditions can also confirmed by the plasma color which changes from a deep red to a bluish color, indicating a change in preponderance from $NF_x$ to fluorine radicals in the plasma.

Thus, the inventors note that a main requirement for speeding up glass etch rate requires the creation of $NF_x$ radicals. However, to date no reports of such high etch rates in high density plasma sources such as ICP-RIE systems exist. This is mainly due to the fact that these conditions cannot be readily reproduced in an ICP-RIE system. In an ICP-RIE process, the pressure is typically too low (~1×10 mbar) and the coupling of high RF power results in a complete breakdown of the $NF_3$ into nitrogen and fluorine radicals. The high density of plasma achieved in ICP chambers results in a very efficient transfer of energy between the RF source and the gas in the chamber and essentially breaks up the molecules into individual atomic radicals and ions. To overcome this limitation and to achieve the incomplete breakup of the $NF_3$ molecules, high chamber pressure is required. However, even if the pressure is increased a 100 times, conventional ICP-RIE processes still cannot achieve the results reported in microwave plasma. Furthermore, at these pressures a high mismatch between the source and chamber load occurs and the typical tuning circuits available on the etching equipment are unable to tune. As a result, any resulting plasma is typically extinguished.

Although the various embodiments will be described primarily with respect to an ICP system, this is solely for illustrative purposes. That is, the various embodiments are not limited to any particular high density plasma source. For example, the high density plasma can be generated using a magnetically enhanced plasma source, a helicon plasma source, or a capacitively coupled plasma source, to name a few. However, other methods for generating high density or any other source of plasma can be considered as suitable for this application. Thus, an ICP source described below with respect to the various figures can be substituted with any other type of high density or ordinary plasma source.

Based on the foregoing, the inventors have determined that in order to exploit the most of the ICP-RIE etchers for glass etching the following conditions are required:
  a. Operation of the ICP-RIE etcher under its normal operating pressure and power range to obtain efficient plasma conditions.
  b. Providing for conditions within the chamber to create incomplete breakup of the $NF_3$ molecules to achieve the high etch rate.
  c. Achieving control over the etch rate, etch smoothness, and anisotropy of the structure independently of the plasma source conditions.
  d. Introduction of water molecules into the chamber either through the nozzle or any other means in the proximity of the substrate.

In view of the foregoing, the various embodiments of the invention are directed to new systems and methods for etching of glass using $NF_3$ gas using ICP-RIE etching. In particular, new systems and method that meet the goals listed above during etching of glass. In the various embodiments, these goals are achieved by incorporating a gas diffuser in the vicinity of the wafer or other material to be etched to provide a localized source of $NF_3$ gas in the ICP-RIE reactor. For example, in one embodiment, a stainless steel gas diffuser ring can be provided on the metal plate on the mechanical clamping plate of the etcher. In particular, the gas diffuser is positioned in the ICP-RIE reactor so that the gas diffuser dispenses $NF_3$ and/or $H_2O$ and/or any other gas of interest right above the wafer.

In operation, the etch process is imitated in a conventional manner. That is, conventional etch process gases are introduced into the ICP-RIE reactor (e.g., Ar, $SF_6$) and a plasma is generated, remote from the wafer, using normal operating conditions. Concurrently, $NF_3$ gas is introduced in the vicinity of the wafer using the gas diffuser. A substrate bias power is applied during this process, which drives the high energy ions generated in the plasma towards the $NF_3$ gas in the vicinity of the wafer. These ions then interact with the $NF_3$ gas to break it down into $NF_x$ radicals. Effectively, this creates a high pressure plasma in the vicinity of the wafer inside a low pressure ICP-RIE chamber. This effective high density $NF_3$ plasma with the incomplete breakdown of the gas molecules is then used to achieve a high etch rate of glasses. In particular, etch rates of 1 μm/min range or higher for glass substrates. In other words, etch rates that are at least an order of magnitude than conventional methods.

In another variation, $H_2O$ is introduced in the proximity of the substrates/wafer to enhance the reactivity of the $NF_3$ radicals with the glass substrate. Water molecules can react with the $NF_x$ and F radicals and scavenge them to create the right etching mixture. Furthermore, water can also help in wetting the glass surface and initiate and mediate reactions on the surface through the interactions with various radicals and ions thus formed in the chamber.

Any sequence of gas introduction through the diffuser ring can be considered. For example, alternate introduction of $NF_3$ gas followed by $H_2O$ gas, or simultaneous introduction of the two gases, or concurrent introduction using two independent nozzles or diffuser rings. Neither gas is limited to $NF_3$ or $H_2O$ only and any gases that contain active species relevant for glass etching can be considered in this arrangement.

In the various embodiments, the energy of the bombarding ions from the plasma can be effectively controlled by the substrate bias which provides an independent control to change the etching conditions for tuning the composition of the $NF_x$ radicals as well as to control the anisotropy. Further, by controlling the plasma gas composition from the gas diffuser, in-situ reactions and gas chemistries in the vicinity of the wafer can be increased or decreased as needed.

FIG. 1 shows a schematic illustration of an ICP-RIE system 100 in accordance with the various embodiments. The system 100 includes many components of a conventional ICP-RIE system. For example, the system 100 can include a plasma chamber 102, serving as a source of inductively coupled plasma or ICP source. The plasma chamber 102 is coupled to a diffusion chamber 104 lined with magnetic portions 106, in which the wafer to be etched is disposed and into which ions from the ICP source are directed towards the wafer to perform the etching.

The plasma chamber 102 can include a gas inlet 108 for introducing gases into the plasma chamber 102. This gas inlet can be coupled to a gas delivery system (not shown) for delivering one or more gases. For example, the gas delivery system can be configured to delivery of $SF_6$, $C_4F_8$, Ar, $O_2$, $CH_4$, $CHF_3$, $CF_4$, $Cl_2$, Xe, Ne, $N_2$, or $NF_3$, or any combinations thereof. The plasma chamber 102 can also be associated with an antenna or coil 110, an RF matching or tuning network 112 and an RF power supply 113 to provide the energy for generating the plasma in the plasma chamber 102.

Figure 2:
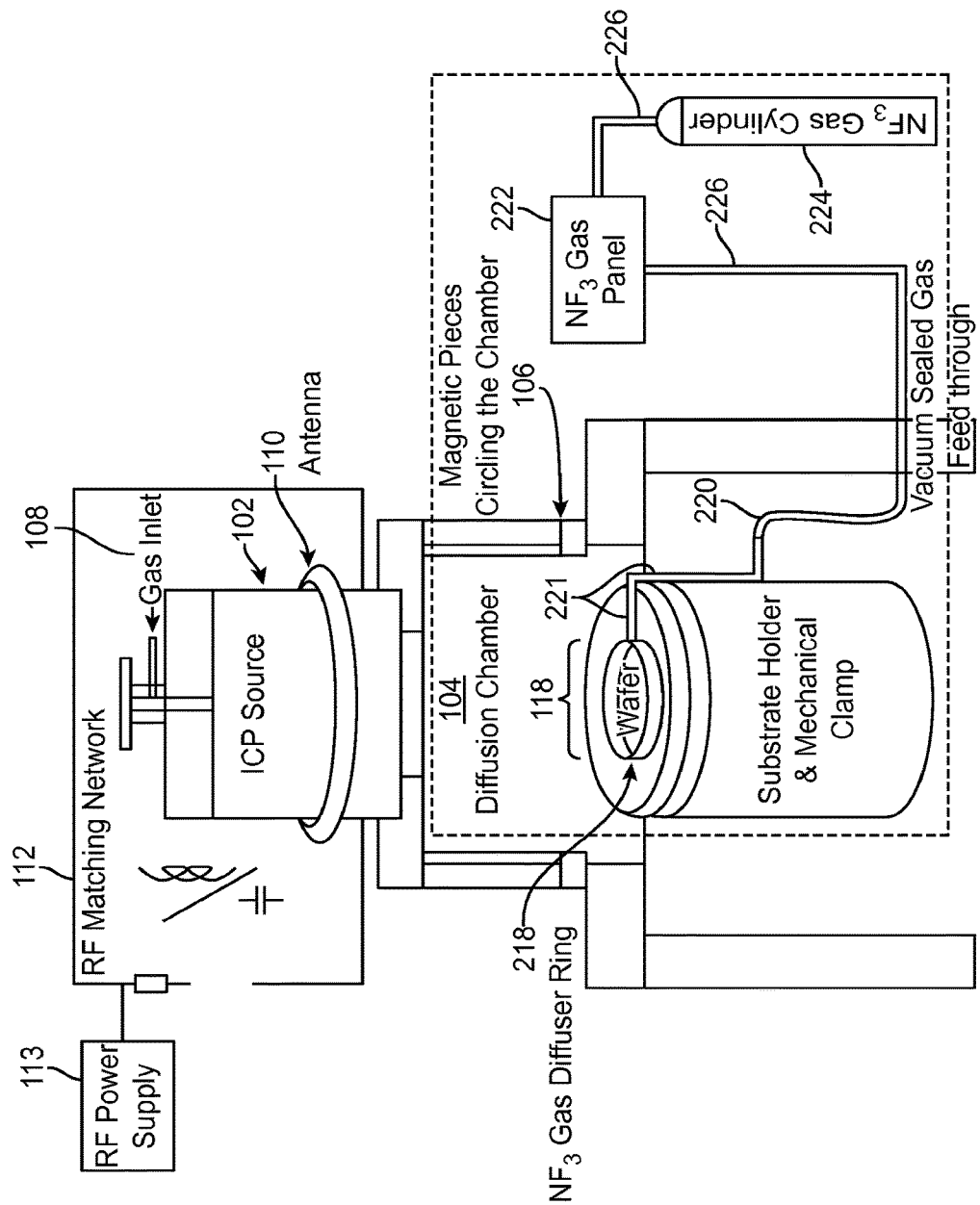
FIG. 2 is a schematic of the system of FIG. 1 utilizing a diffuser ring.

The diffusion chamber 104 can include a substrate holder and clamp 114 for supporting and securing a wafer. As shown in FIG. 2, the substrate holder 114 can be configured such that the position (i.e., the height) of the wafer in the diffusion chamber can be changed as required to reduce or increase the distance between the plasma chamber 102 and the wafer. During etching, the temperature of the wafer can be controlled using back side Helium cooling lines 116 coupling the substrate holder 108 to a chiller (not shown). The He cooling lines can be configured to allow temperatures between −20-50° C. The substrate holder and clamp 114 can be further configured to serve as an electrode coupled to a second RF generator or power supply 116 via a second RF matching/tuning network 115 to provide substrate bias. This second RF generator 116 and second RF matching/tuning network 115 can be configured to be decoupled from and operate independently of the RF generator 113 and RF matching tuning network 112 associated with the plasma chamber 102.

Although FIG. 1 and other descriptions refer to discrete plasma and diffusion chambers, the various embodiments are not limited in this regard. That is, in some configurations, a single chamber can be provided with different regions to serve as the plasma chamber 102 and the diffusion chamber 104.

In addition to the foregoing, the system 100 can include a gas diffuser 118 coupled to a gas delivery system (not shown) via feedthroughs 120 for introducing $NF_3$ gas and other gases, separately or in combination, into the diffusion chamber 104 in the vicinity of substrate holder 114 when in the elevated position. Such other gases can include, but are not limited to $H_2O$. In the various embodiments, the gas delivery system for the gas diffuser 118 can be the same or different than the gas delivery system for inlet 108. However, providing a separate gas delivery systems for inlet 108 and gas diffuser 118 can be advantageous. That is, separate systems provide greater flexibility and control. For example, the mixture of gases introduced via inlet 108 and gas diffuser 118 can be different.

Figure 3:
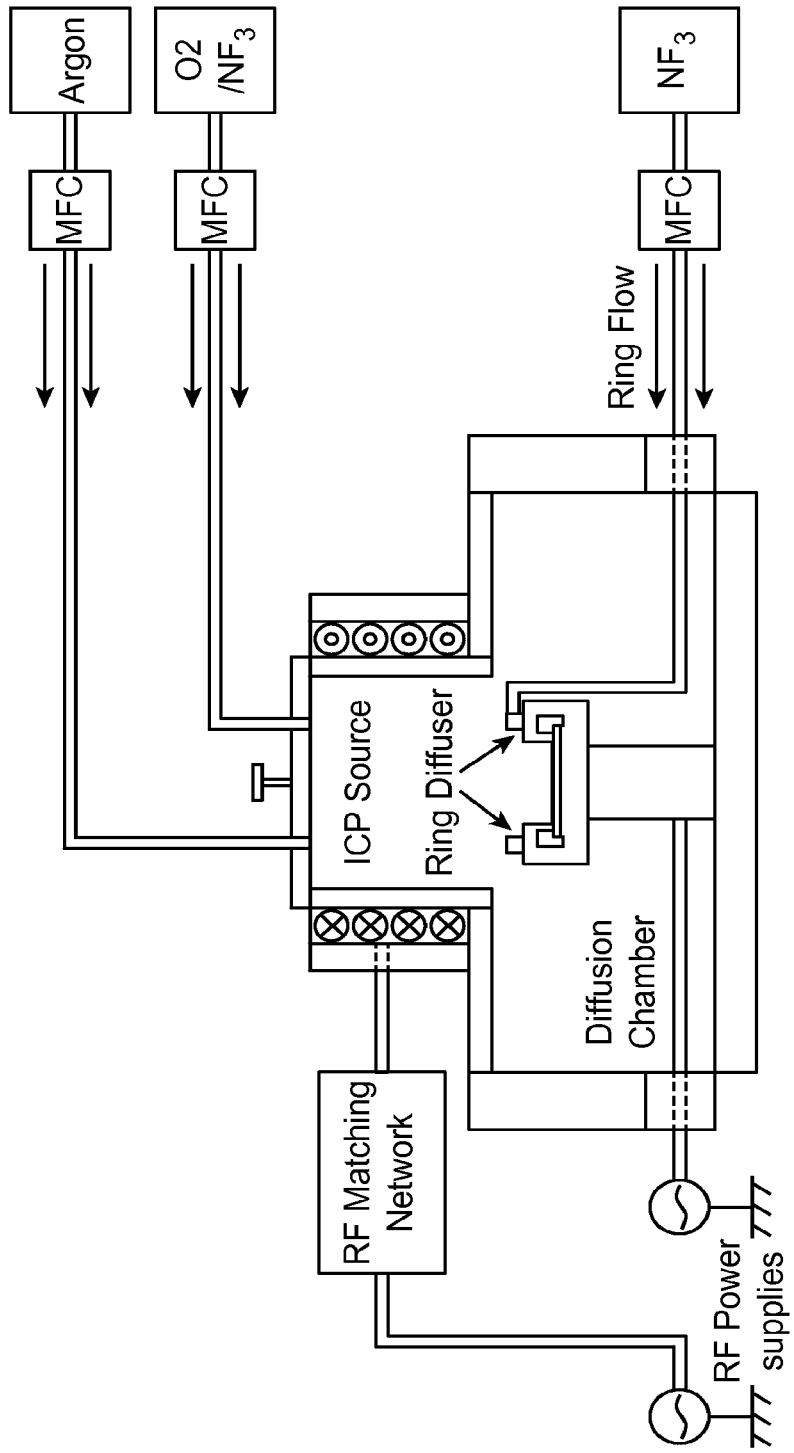
FIG. 3 shows a modified etching system in accordance with the various embodiments.

In the various embodiments, the gas diffuser 118 can be implemented in a variety of ways. In some embodiments, as illustrated in FIG. 2, the gas diffuser 118 can be implemented as diffuser ring 218, flexible feedthroughs 220 coupling the diffuser ring 218 to a gas panel 222, and an NF3 gas source 224 coupled to gas panel 222. In one particular embodiment, the diffuser ring 214 can be constructed using a ⅛ inch electro-polished stainless steel tube drilled with 0.5 mm holes at a distance of 10 mm bent into a 4" circular tube. Thereafter this tube can be welded onto the substrate holder and clamp 108. The tube can be coupled via flexible gas tubing, serving as flexible feedthroughs 220, to the gas panel 222 to permit gas delivery and to account for the different positions of the substrate holder and clamp 108. For example, stainless steel flexible gas tubing using VCR fittings can be used to bring the process gas to the diffuser ring 218. Additionally one or more the flexible feedthroughs 220 can include non-flexible portions or segments 221, as shown in FIG. 3. Further, additional tubing 226 can be provided to connect the various components described above.

Although the discussion above describes that the gas diffuser 114 is implemented as a diffuser ring, the various embodiments are not limited in this regard. Rather, any other structure can be used in the various embodiments. For example, the gas diffuser 118 can be implemented using individual nozzles disposed in the vicinity of the substrate. In another example, gas diffuser 118 can be implemented using multiple sections of tubing with holes or openings. Further, although the diffuser ring 214 is described as containing holes or openings disposed substantially along a same plane parallel to that of the wafer, having a particular size, and having a particular spacing, the various embodiments are not limited in this regard. Rather, a gas diffuser in accordance with the various embodiments can provide any placement, spacing, size, or other arrangement of holes or openings for introducing gases into diffusion chamber 104. Similarly, other configurations of gas diffuser 118 can be configured with a wide array of geometries.

The gas panel 222 can also be configured in a variety of ways. In one particular embodiment, a precision needle valve can be used to control the gas flow rate of $NF_3$ (or other gases) into the diffusion chamber 104. In one particular embodiment, a $NF_3$ flow rate of 300 sccm or less can be used. However, any other methods for controlling gas flow rate can be used in the various embodiments.

In one particular embodiment, a precision needle valve can be used to control the gas flow rate of $H_2O$ (or other gases) into the diffusion chamber 104. In one particular embodiment, a $H_2O$ flow rate of 300 sccm or less can be used. However, the flow rates and methods for controlling gas flow rate can vary in the various embodiments.

In addition to the foregoing, the system 100 can include additional modifications compared to conventional ICP-RIE systems. For example, plasma shielding plates may need to be modified to accommodate the additional components for the system 100. In some embodiments, the system 100 can also be coupled to a mass-spectrometer system (e.g., a residual gas analyzer) to measure the gas species created within the chamber to monitor and adjust the etching process. Additionally, optical windows can be provided to monitor the visible/UV spectra of the plasma and evaluate the plasma glow composition during etching.

The modifications described above allow an ICP-RIE reactor in accordance with the various embodiments to be used in a variety of modes. A first mode of operation is simply to utilize the ICP-RIE reactor to perform etching under normal operating conditions. That is, to perform conventional (i.e., low etch rate) etch processes. For such normal operations, the plasma etching occurs by generating a plasma using an etching gas chemistry (e.g., $NF_3$ and Ar) without introducing gases through the gas diffuser. That is, referring back to FIG. 1, gases are introduced view inlet 108 and a plasma 130 is generated in plasma chamber 102. Concurrently, a substrate bias is provided at substrate holder and clamp 114, which causes ions generated in the plasma 130 to be directed towards substrate holder and clamp 114 and any wafer disposed thereon. The ions are then used to perform conventional etching. Such a mode can be utilized when low etch rates are desirable to accurately.

A second mode is to utilize the gas diffuser to generate enhanced etching conditions. In such a mode, the system can be initially setup in the first mode, as described above. Thereafter, the etch gas ($NF_3$) can be introduced into the ICP-RIE reactor via the gas diffuser and the enhanced etching (high etch rate) will be performed. That is, as described above, the plasma 130 is generated and the substrate bias is used to direct ions from the plasma 130 towards the wafer. However, via gas diffuser 118, a region 132 with an increased density of $NF_3$ gas, localized around the wafer, is provided. The interaction of the ions from the plasma 130 with the $NF_3$ 132 in region 132 causes the generation of $NF_x$ radicals. That is, the ions are utilized to break up the $NF_3$ in region 132 to provide the incomplete breakup of $NF_3$. This results in effectively forming a high density plasma of $NF_x$ radicals in the vicinity of the wafer. Consequently, the presence of a high concentration of these $NF_x$ radicals enhances the etch rate.

Although the various embodiments are described with respect to the enhanced etching of glasses using a $NF_3$-based chemistry in an ICP-RIE reactor modified to include a gas diffuser, the various embodiments are not limited in this regard. Rather, the systems and methods described herein can be applied to the etching of any other types of materials and using other types of chemistries.

Examples

The following examples and results are presented solely for illustrating the various embodiments and are not intended to limit the various embodiments in any way.

Smooth dry etching of some types of borosilicate glass wafers has been a challenge due to nonvolatile or less volatile metal-halogen compounds forming on the surface of the etched area. Thus, the methods of the various embodiments have been evaluated. In particular, to evaluate the methods of the various embodiments, two alternative etching method were investigated in regards of smooth and fast etching; i) Conventional $Ar/NF_3$ downstream plasma etching ii) $Ar/O2/NF_3$ plasma etching where an inductively coupled plasma reactor is modified such that a ring shape diffuser system is adapted to the substrate holder in order to supply high local etchant flux, $NF_3$, over the substrate surface. The latter approach, in accordance with the various embodiments, reduces the full dissociation of $NF_3$ in $NF_3/AR$ and $O2$ based plasma and resulted in forming more reactive species in the plasma RGA (Residual gas analysis) show that the diffuser system allows to form larger amounts of $NF_x$ radicals in the plasma. Further, ex-situ X-ray Photoelectron Studies (XPS) showed non-volatile metal alkali compounds are formed on the surface on rough surfaces, with NaF being the prominent compound for the Schott Borofloat glass. For smooth surfaces, less alkali compounds are observed. The results demonstrated that ultra-smooth etch surfaces can be obtained within a window of parameters, where the arithmetic mean smoothness (Ra) varies from 3.4 Å to 8 Å at considerable etch rates of 0.343 μm/min to 0.55 μm/min.

I. INTRODUCTION

One of the most important and challenging parameters in micromachining of Borofloat glass is obtaining smooth surfaces at considerable etch rates [13]. Despite the fact that, controlled surface roughness is shown to be useful for some specific applications [14], surface roughness in general is highly unwanted in most of the applications such as optical applications and micro-electro-mechanical systems (MEMS) [15]. If the surface is rough and wavy, the light is scattered in optical applications. Therefore, high precision optical applications require close to atomically flat surface roughness (Ra~0.5-1 nm). For micro machined resonators and sensors, roughness negatively affects the quality factor and thus decreases the fabricated device performance. The causes of increased roughness are due to the impurities exist in glass substrates and due to the less percent metal containing compounds other than $SiO_2$, where these metal based compounds form non-volatile or less volatile metal halogens in fluorine containing plasmas (i.e., Argon/$SF_6$) during dry etching. For instance, Borosilicate glass, is mainly composed of 81% of $SiO_2$, 13% of $B_2O_3$, 4% of $Na_2O/K_2O$ and 2% of $Al_2O_3$. The non-volatile metal/alkali metal halogens (i.e., NaF and $AlF_3$) forming on the surface cause micromasking in the etch regions resulting in the formation of needle-like structures and therefore destructing the smoothness. As a solution, highly energetic argon ions are proposed as the physical etch mechanism to remove these compounds from the surface to achieve better roughness, but as the argon percent ratio in the gas mixture is increased, the etch rate decreases significantly [16]. Furthermore, the arithmetic mean roughness (Ra) is still reported on the range of 2 nm to 100 nm in these cases [16]-[19].

II. ETCHING MECHANISM

Figure 4:
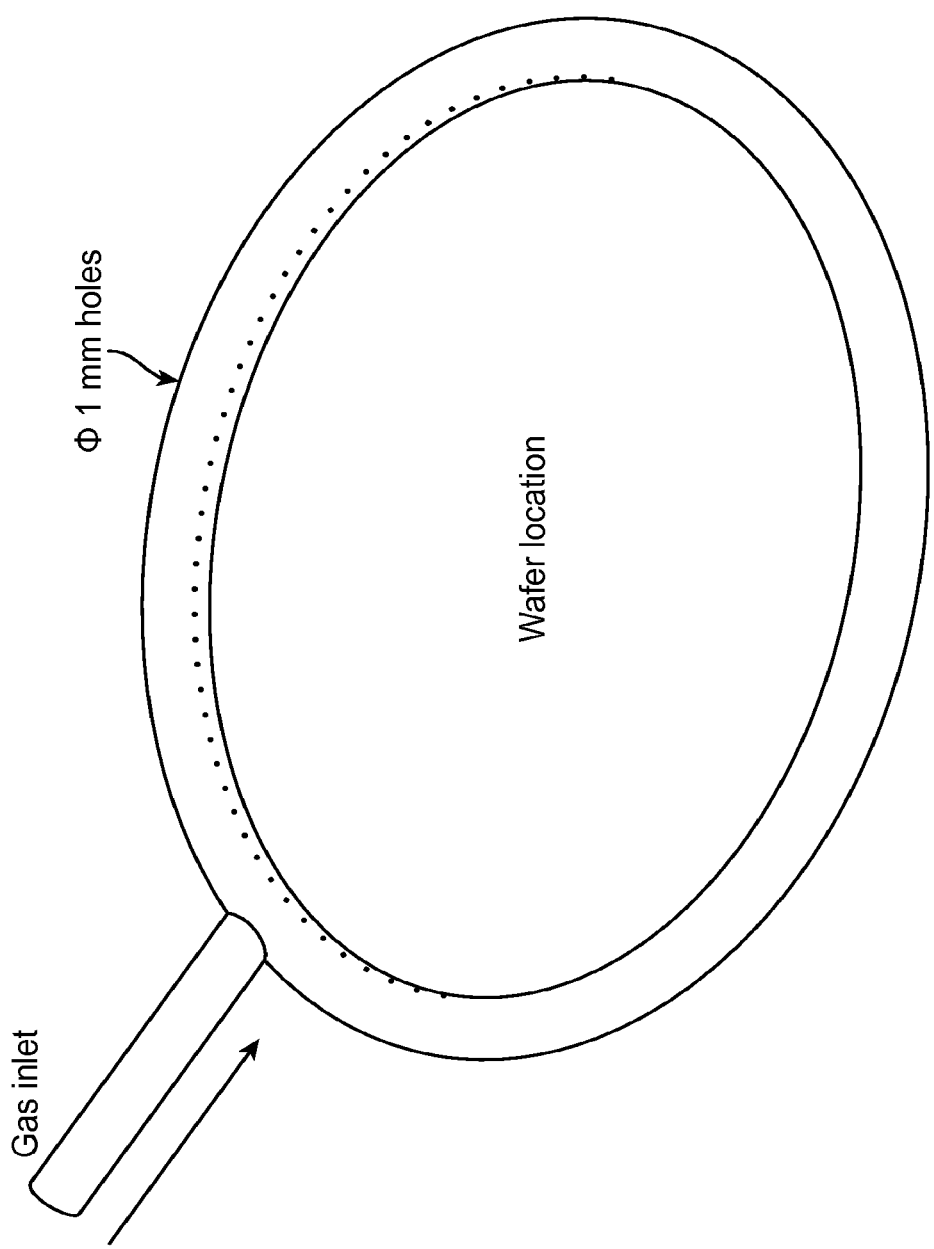
FIG. 4 shows a ring diffuser with 1 mm holes in accordance with the various embodiments.

In this study, an etching system in accordance with the various embodiments was utilized in order to achieve smoothness at considerable etch rates. A radio frequency (RF) inductively coupled plasma etching system (Alcatel AMS 100, manufactured by Alcatel-Lucent of Paris, France) is modified, where a ring diffuser mechanism is attached to the substrate holder. The whole system and the ring are shown in FIGS. 3 and 4. FIG. 3 shows a modified etching system in accordance with the various embodiments and FIG. 4 shows a ring diffuser with 1 mm holes in accordance with the various embodiments. The ring has a diameter of 9.6 cm and has diffuser holes that are placed within 1 mm spacing.

In most of the ICP applications and in the case of unmodified etching system chemical and physical etchants are introduced via the gas inlets located at the top of the ICP chamber [20]. The plasma is formed within this chamber and directed towards the substrate in a downstream fashion via the applied electric field between the source and the substrate. The main purpose of the ring diffuser proposed here is to enhance the reactive ion etching via establishing high local flux of reactive species on etch face of the wafer, combining the downstream flux with the local ring flux. Before characterizing the effect of ring design on smoothness, etch rate and hard mask selectivity over substrate, classical downstream etches using Ar and $NF_3$, where the ring is inactive, are performed in sake of determining the etch performance. A set of experiments utilizing design of experiments involving orthogonal arrays are carried out to obtain optimum conventional ring-inactive downstream etching parameters using $Ar/NF_3$ plasma (Please refer to the supplemental information for the detailed experimentation). Double-side polished, 4 inches Borosilicate wafers are used as the substrates during all experiments performed. The wafers are patterned with 100 um, 250 um, 500 um and 1 mm rectangular openings. 2-3 um thick nickel is plated on the wafers, acting as hard mask during the etch. Each sample is etched for 1 hour at 20° C. substrate temperature. The results for fastest and smoothest $Ar/NF_3$ etches are demonstrated in Table 1.

TABLE 1

Baseline results for AR/NF$_3$ conventional ICP plasma.

| | ICP power | Substrate Power | Stage position | Pressure | Ar flow rate | NF3 flow rate | Etch rate | Smoothness (Ra) |
|---|---|---|---|---|---|---|---|---|
| Fastest | 2000 W | 400 W | 120 mm | $6.5 \times 10^{-6}$ bar | 10 sccm | 30 sccm | 0.41 μm/min | 79.6 nm |
| Smoothest | 2000 W | 400 W | 120 mm | $12 \times 10^{-6}$ bar | 30 sccm | 12.5 sccm | 0.31 μm/min | 28.1 nm |

Figure 5A:
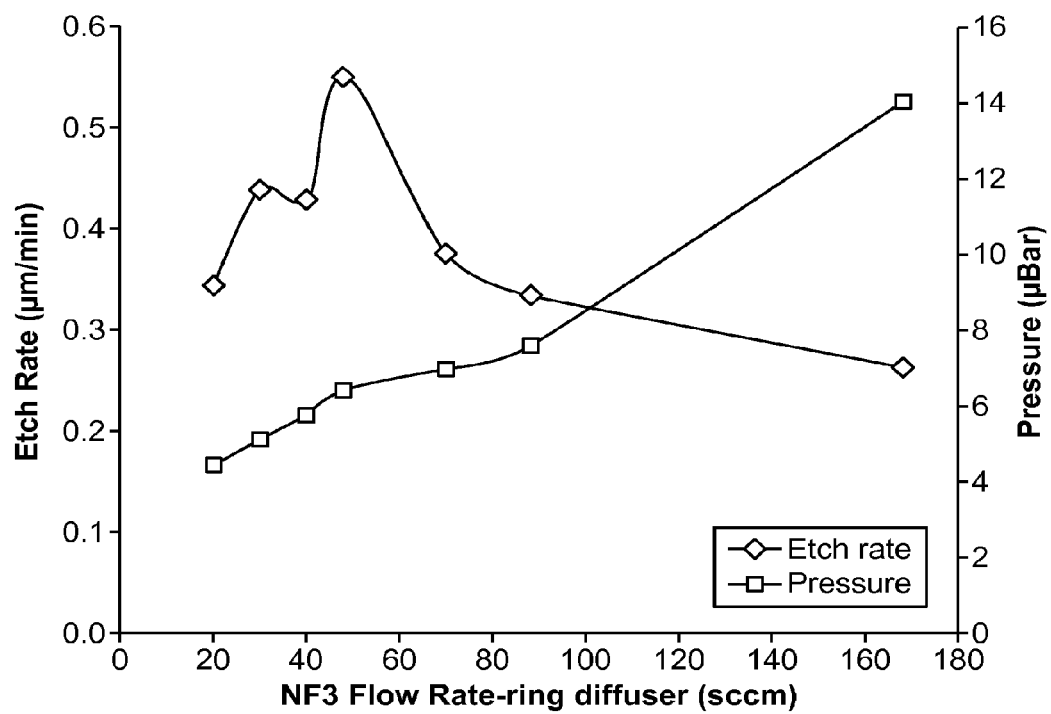
FIG. 5A is a plot of NF3 flow rate through the ring diffuser versus etch rate for a system in accordance with the various embodiments.
Figure 5B:
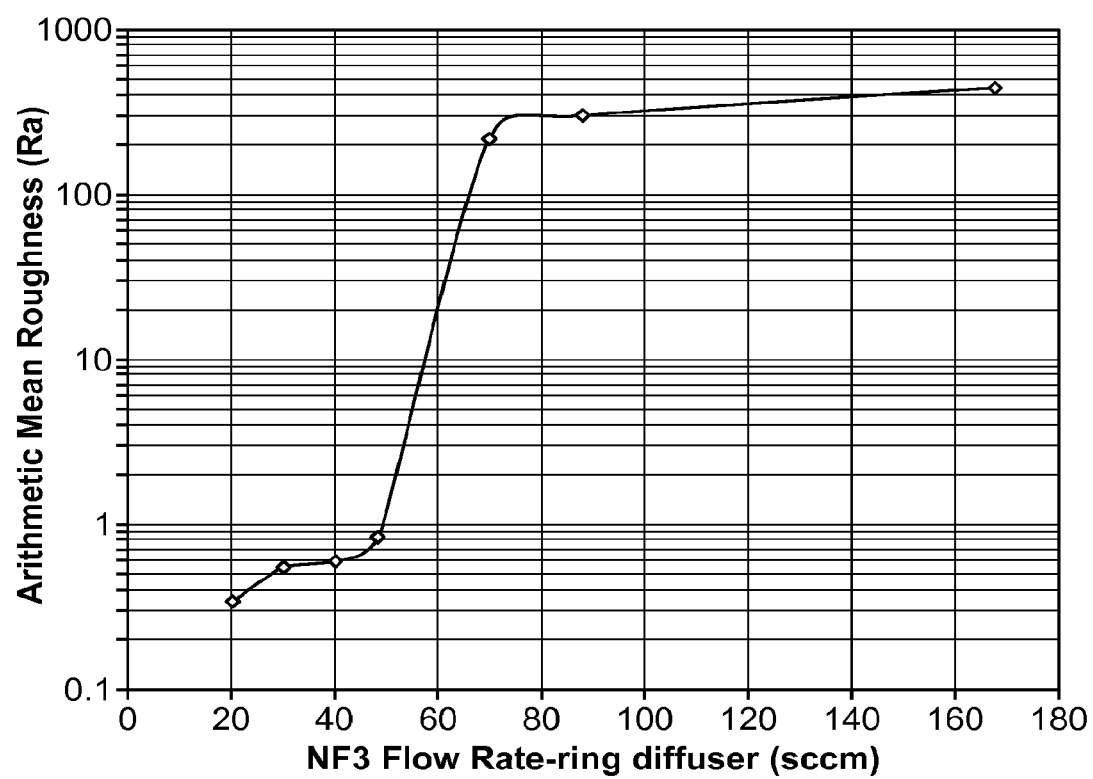
FIG. 5B is a plot of NF3 flow rate through the ring diffuser versus smoothness for a system in accordance with the various embodiments.

Summarized results from Table 1 are taken into consideration to start experimental design of the ring active experiments. For the ring-active experiments, 20 sccm of Ar and 10 sccm of $O_2$ are introduced from top into the ICP chamber. The ICP power, substrate power and the stage position are all held constant with the ones stated in Table 1. The pressure is not regulated. Various flow rates of $NF_3$ are feed through the ring diffuser. FIGS. 5A and 5B shows the etch rate and recorded operating pressure along with the smoothness in the chamber when the ring is active. The etch depths are measured via a Tencor P16+ profilometer, manufactured by KLA Tencor of Milpitas, Calif. and the roughness is measured via a PSIA XE-100 Scanning Probe Microscope, manufactured by Park Systems Corporation of Santa Clara, Calif.

Figure 6A:
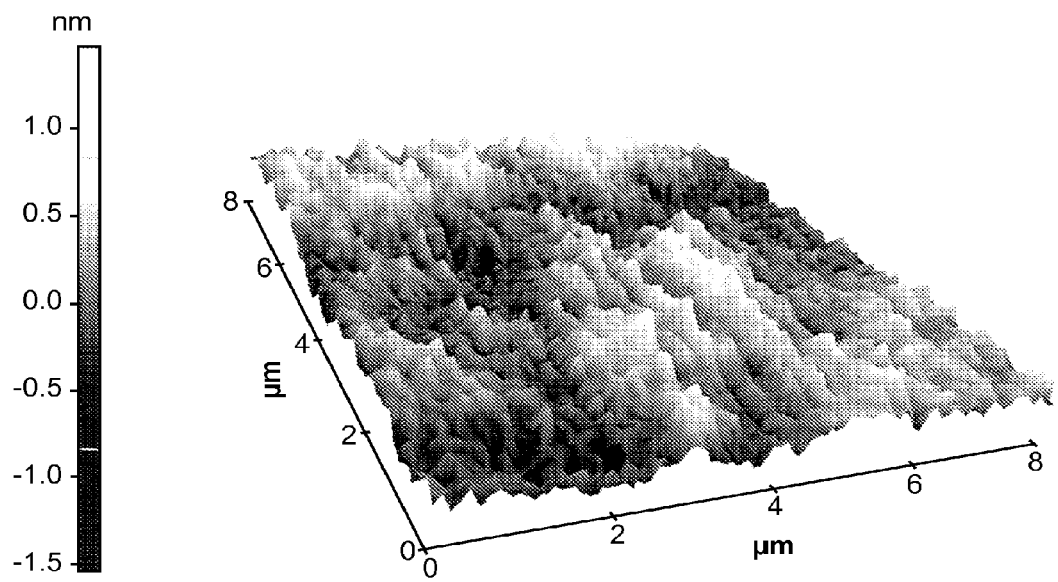
FIG. 6A is an AFM image of the smoothest substrate obtained with an ring active etch in accordance with the various embodiments.
Figure 6B:
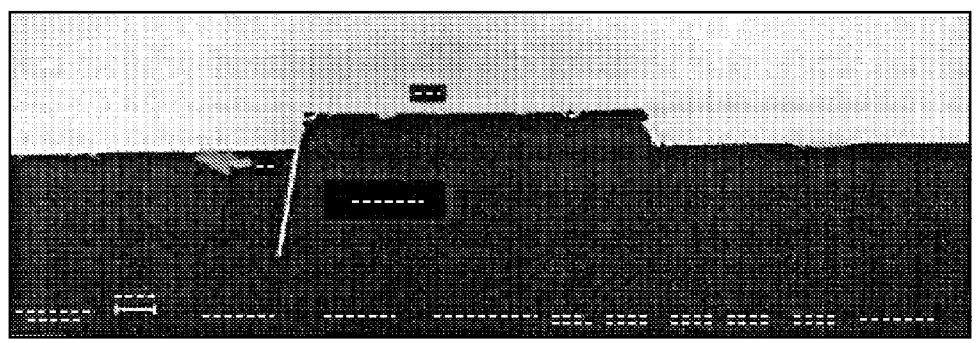
FIG. 6B is an SEM image of the etch region cross section for the substrate of FIG. 6A.

As the ring is utilized and the $NF_3$ flow is kept between 20-50 sccm, high etch rates and ultrasmooth surfaces are obtained. The maximum etch rate, 0.55 μm/min, is achieved at 20 sccm Ar/10 sccm O2/48 sccm $NF_3$ flows. The best smoothness, Ra=3.4 Å, is achieved at 20 sccm flow, where the wall slope was 82.4°. An Atomic Force microscope (AFM) image and an scanning electron microscope (SEM) image of the substrate are shown in FIGS. 6A and 6B, respectively. The obtained smooth substrates can be readily used for optical applications involving high precision (Ra<5 Å) and super precision (Ra<3 Å).

Even at the highest etch rate, Ra is measured as 8.4 Å. However, the smoothness is heavily degraded once the ring flow rate is above 50 sccm. In this case, Ra is at least 2 orders of magnitude larger in high flow regions where the chamber pressure is >6.3 μBar.

When compared to conventional downstream etching with Ar/$NF_3$, where the results are tabulated in Table 1, the etch rate with the ring is improved 34%. The nickel selectivity at downstream Ar/$NF_3$ plasma is measured as 7.35:1 over Borosilicate glass. In ring active experiments of FIGS. 4A and 4B, the selectivity is measured as 9.32:1 for the fastest etch rate, indicating a 27% improvement.

Figure 7A:
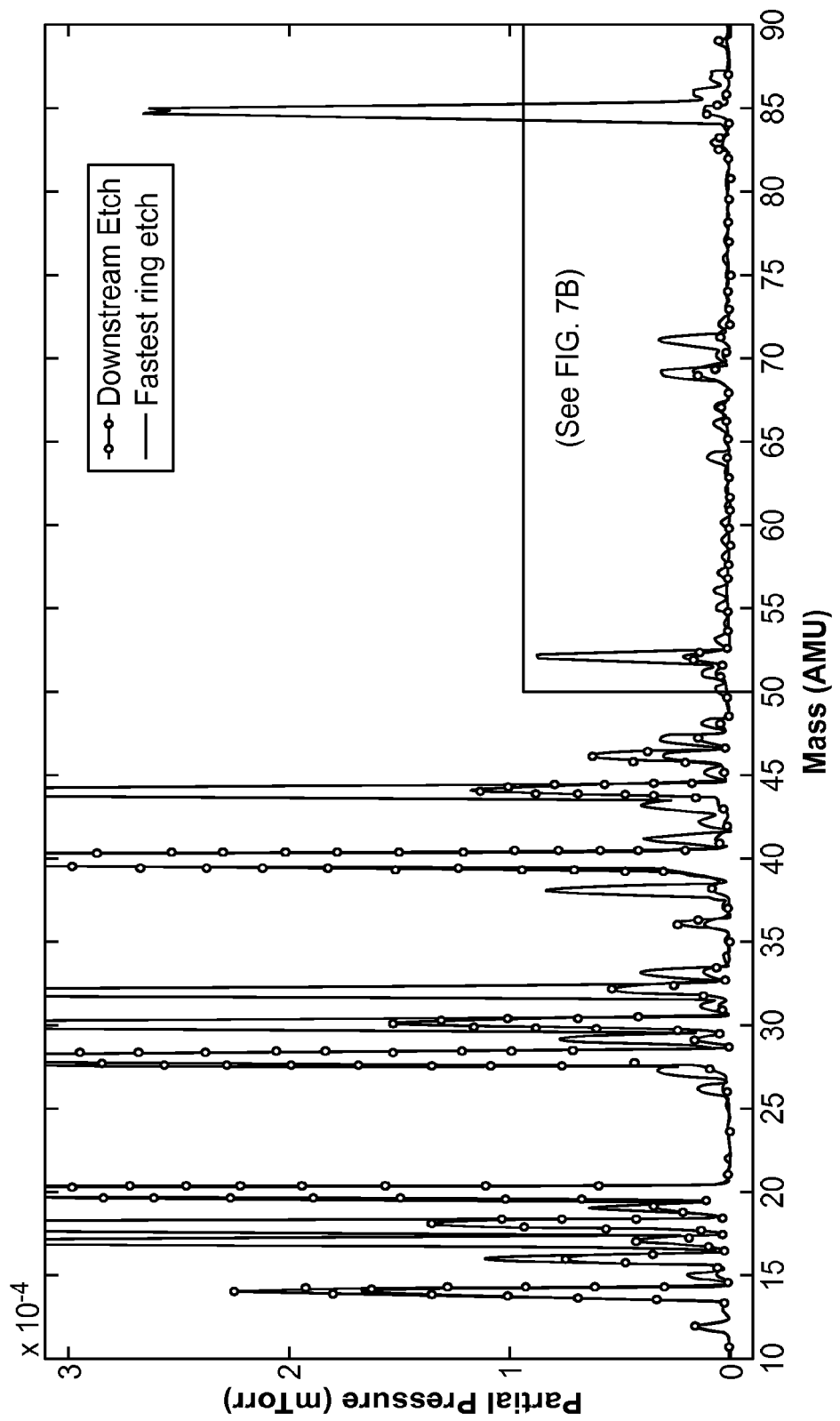
FIG. 7A shows residual gas analyzer data for two methods, including a method in accordance with the various embodiments.
Figure 7B:
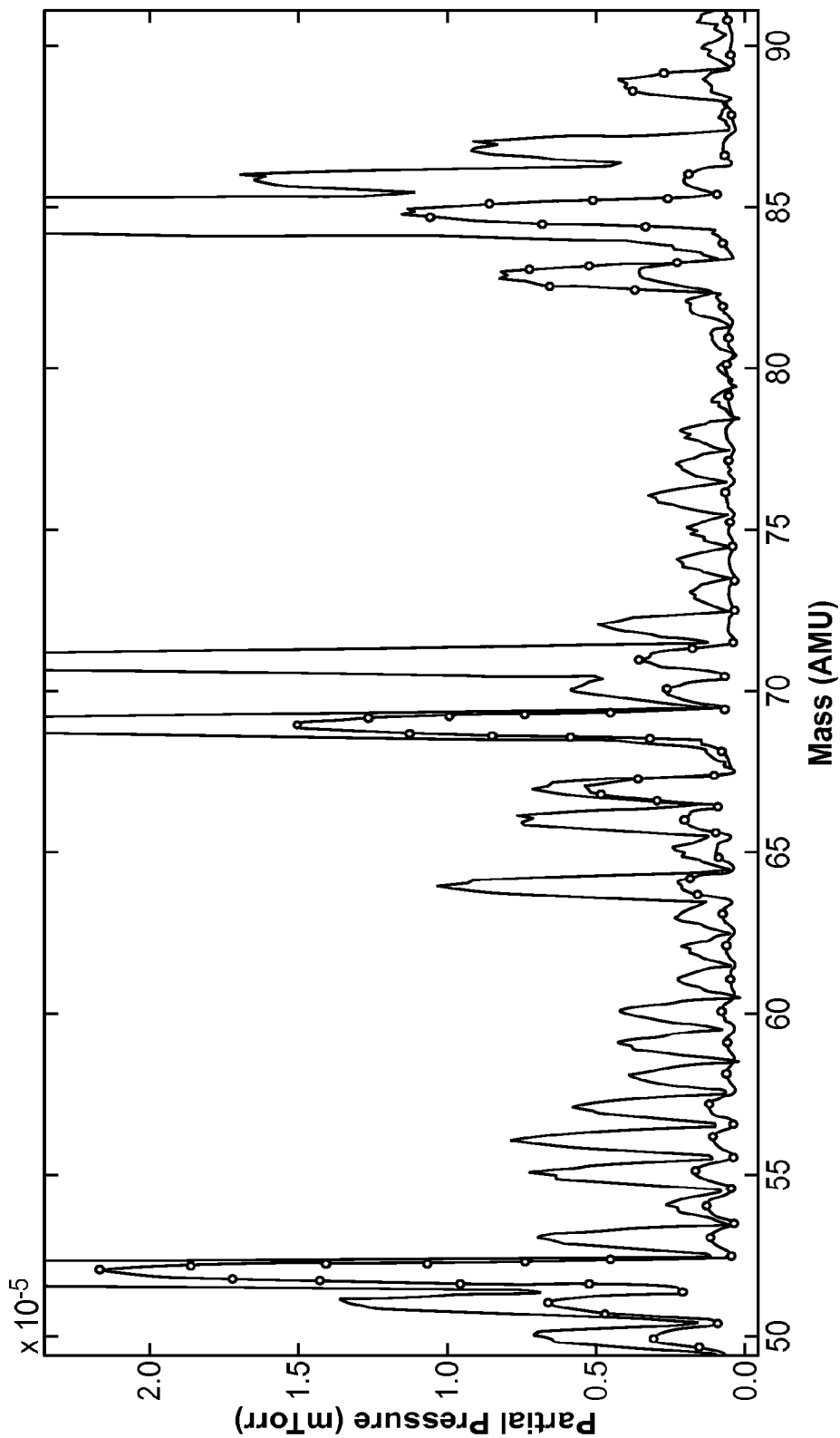
FIG. 7B shows a detailed view of a portion of the data of FIG. 7A.

The superior performance of one etching method among two etching methods is mainly due to the diffuser mechanism. The aim to have diffuser mechanism in place is to decrease the dissociation rate of $NF_3$ and obtain more $NF_x$ radicals in the plasma. It is previously stated that the low percent dissociation of $NF_3$ improves the etching speed of borosilicate glass [21]. In order to determine the gas species forming in the plasma, a Residual Gas Analyzer (Extorr XT 100, manufactured by Extorr, Inc. of New Kensington, Pa.) is used. FIGS. 7A and 7B show two RGA data: for the ring active etch at 48 sccm $NF_3$ flow rate and for Ar/$NF_3$ plasma with fastest etch rate shown in Table 1. From FIGS. 7A and 7B, it is clearly observed that the plasma creates considerable partial pressure of $NF_x$ ($NF^+$ and $NF_2^+$ at the peaks 33 and 52 respectively) radicals in the plasma. In addition, $NF_3$ at peak 71 has considerable partial pressure. However, in conventional Ar/$NF_3$ plasma, there is no peak at $NF_3$, proving a full dissociation in the gas. There are less $NF_2$ and NF radicals, indicating $NF_3$ dissociated mostly to N and F. The highly energetic Argon ions, which is accelerating towards the wafer surface first interacts with a local flux of $NF_3$ gas that is just over the substrate. The collisions between Argon and $NF_3$ create high concentrations of $NF_x$. $NF_x$ radicals may act more aggressive to glass and thus improve the etch rate. In addition, heavier gasses are formed when the ring is active. The peak 84 may highly correspond to $NF_2O_2$ gas. The authors articulate there may be $NF_xO_x$ based gas formation when $NF_3$ is diffused through the ring, which may be playing a critical role in smoothness and fast etching. This is further discussed in below.

As it is pointed out above, smoother surfaces are obtained via the diffuser system. In order to understand the smoothness achievement further and to determine the surface chemistry by estimating the atomic composition of the surfaces, X-ray Photoelectron Spectroscopy (XPS) is used. Three etching results are compared in XPS study: i) the fastest etch obtained in Ar/$NF_3$ etching system shown in table 1 ii) Ring active etch with 20 sccm $NF_3$ flow iii) Ring active etch with 80 sccm flow. All these have 79.6 nm, 0.34 nm and 350 nm of Ra respectively. These 3 runs are selected to compare two different etching methods and determine the effect of ring diffuser system on roughness. As previous studies in literature indicate, the non-volatile species negatively affect the smoothness. Not only the smoothness is lost by these species, but the etch rate also decreases (the degree of decrease depending on the composition of the glass type) as the non-volatile species concentration/accumulation on the substrate surface increases during the etching [22]. Therefore, high resolution XPS scans have been performed for Sodium (Na), Boron (B), Aluminum (Al) and Potassium (K). Table 2 shows the atomic percent calculations of 3 etching results emphasized.

TABLE 2

Approximate atomic percent calculations from XPS surveys for 3 different etch cases comparing two etching approach. All values are in percent.

| | Si 2s | O 1s | F 1s | Na 1s | B 1s | Al 2s | K 2s | Ni 2p |
|---|---|---|---|---|---|---|---|---|
| Ar/$NF_3$ fastest etch | 4.01 | 8.979 | 57.76 | 18.56 | ND* | 7.646 | 1.279 | 1.768 |
| Ring active etch- 20 sccm $NF_3$ | 20.7 | 51.696 | 15.751 | 7.526 | 2.105 | 2.22 | ND* | ND* |
| Ring active etch- 80 sccm $NF_3$ | 4.483 | 6.487 | 56.448 | 20.946 | 4.144 | 5.102 | 1.887 | ND* |
| Unprocessed wafer | 27.91 | 66.92 | ND* | 0.46 | 4.69 | ND* | ND* | ND* |

*ND: Not Detectable amount.

From approximate atomic percent calculations, it is observed that the rough samples have high Al, K and Na percentage. However, it is interesting to note that Na is the most prominent amongst them. For the conventional $Ar/NF_3$ etching and high flow ring active etching have very high Na concentrations (>15%) at the surface, whereas smooth ring active etch has 7.5% Na concentration. When Ra roughness is considered, this much of difference in Na percentages causes 2 orders of magnitude worse roughness. These results infer that the smoothness is enhanced via ion enhanced chemical reaction introduced by the ring diffuser system.

In conclusion, a system configured in accordance with the various embodiments can be used to obtain smooth surfaces on borosilicate glass and is integrated with a commercial ICP etching system, where $NF_3$ is supplied to the diffuser. The effects of the mechanism are compared with conventional $Ar/NF_3$ plasma etching. Ultra-smooth etching is achieved with Ra<5 Å at considerable etch rates. The smoothness is degraded at high flows of $NF_3$ (>50 sccm). The main reason of this degradation is due to the high percentages of Na (in NaF form) on the surface. At smooth etches, the Na concentration is found out to be less in atomic percent. The authors articulate that higher amount of $NF_x$ radicals and possible existence $NF_xO_x$ gasses effectively remove Na from the surface in the light of RGA readouts.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

REFERENCES

The following references describe concepts associated with various aspects of the invention and are each incorporated by reference in their entirety:

[1] L. Li, T. Abe, and M. Esashi, Journal of Vacuum Science & Technology B (Microelectronics and Nanometer Structures), vol. 21, p. 2545, 2003.

[2] X. Li, T. Abe, and M. Esashi, Proceedings of IEEE Thirteenth Annual International Conference on Micro Electro Mechanical Systems, Miyazaki, Japan, 2000, p. 271.

[3] A. Goyal, V. Hood, and S. Tadigadapa, Journal of Non-Crystalline Solids, vol. 352, p. 657, 2006.

[4] S. Queste, R. Salut, S. Clatot, J.-Y. Rauch, G. Chantal, and M. Khan, Microsystems Technology, vol. 16, pp. 1485-1493, 2010.

[5] S. Karecki, R. Chatterjee, L. Pruette, R. Reif, T. Sparks, L. Beu, V. Vartanian, and K. Novoselov, Journal of the Electrochemical Society, vol. 148, pp. 141-9, 2001/03/2001.

[6] S. S. Choi, D. W. Kim, and M. J. Park, Journal of the Korean Physical Society, vol. 45, pp. 1500-1504, December 2004.

[7] C.-H. Yang and C.-M. Dai, Proceedings of the SPIE—The International Society for Optical Engineering Optical Microlithography XI, 25-27 Feb. 1998, vol. 3334, pp. 553-8, 1998/1998.

[8] F. H. Bell, O. Joubert, G. S. Oehrlein, Y. Zhang, and D. Vender, Journal of Vacuum Science & Technology A (Vacuum, Surfaces, and Films), vol. 12, pp. 3095-101, 1994/11/1994.

[9] G. Adegboyega, I. PerezQuintana, A. Poggi, E. Susi, and M. Merli, Journal of Vacuum Science & Technology B, vol. 15, pp. 623-628, May-June 1997.

[10] B. A. Cruden, M. V. V. S. Rao, S. P. Sharma, and M. Meyyappan, Journal of Vacuum Science & Technology B (Microelectronics and Nanometer Structures), vol. 20, pp. 353-63, 2002/01/2002.

[11] A. Nagy, Optical Engineering, vol. 31, pp. 335-340, February 1992.

[12] C. H. Lin, G. B. Lee, Y. H. Lin, and G. L. Chang, Journal of Micromechanics and Microengineering, vol. 11, pp. 726-732, November 2001.

[13] Xinghua Li, Takashi Abe, and Masayoshi Esashi, Sensors and Actuators A: Physical 87 (3), 139 (2001).

[14] E. Hein, D. Fox, and H. Fouckhardt, Journal of Applied Physics 107 (3), 033301 (2010).

[15] A. M. Hynes, H. Ashraf, J. K. Bhardwaj, J. Hopkins, I. Johnston, and J. N. Shepherd, Sensors and Actuators A: Physical 74 (1-3), 13 (1999); Lee A. Donohue, Janet Hopkins, Richard Barnett, Andrew Newton, and Anthony Barker, 44 (2004).

[16] T. Ichiki, Y. Sugiyama, R. Taura, T. Koidesawa, and Y. Horiike, Thin Solid Films 435 (1), 62 (2003).

[17] D. A. Zeze, R. D. Forrest, J. D. Carey, D. C. Cox, I. D. Robertson, B. L. Weiss, and S. R. P. Silva, Journal of Applied Physics 92 (7), 3624 (2002).

[18] S. Queste, R. Salut, S. Clatot, J. Y. Rauch, and ChantalG Khan Malek, Microsystem Technologies 16 (8-9), 1485 (2010).

[19] Abhijat Goyal, Vincent Hood, and Srinivas Tadigadapa, 61110P (2006).

[20] H. Sugai, K. Nakamura, Y. Hikosaka, and M. Nakamura, Journal of Vacuum Science & Technology A: Vacuum, Surfaces, and Films 13 (3), 887 (1995).

[21] Koji Yamakawa, Masaru Hori, Toshio Goto, Shoji Den, Toshirou Katagiri, and Hiroyuki Kano, Applied Physics Letters 85 (4), 549 (2004).

[22] EzzEldin Metwalli and Carlo G. Pantano, Nuclear Instruments and Methods in Physics Research Section B: Beam Interactions with Materials and Atoms 207 (1), 21 (2003).

What is claimed is:

1. A method for reactive ion etching of a substrate, the method comprising:
   forming a plasma comprising ions and electrons of a first gas at a first location remote from a surface of the substrate, the substrate being held on a substrate holder;
   introducing at least one processing gas different from the first gas at a second location in an immediate vicinity of the surface of the substrate through a plurality of openings positioned about the periphery of the surface of the substrate;
   directing ions and electrons from the plasma of the first gas to the surface of the substrate, the ions and electrons from the plasma of the first gas interacting with the at least one processing gas to generate at least one radical of the at least one processing gas from an incomplete breakdown of the processing gas to form a concentrated plasma of the at least one radical in the immediate vicinity of the surface of the substrate, wherein the at least one radical is reactive with the surface of the substrate to perform etching of the surface;
   etching the surface of the substrate with the radicals and by ion bombardment; and
   wherein the first location and the second location are located in a single chamber.

2. The method of claim 1, further comprising selecting the at least one other processing gas to comprise Ar and NF3.

3. The method of claim 1, wherein the substrate holder is a variable position substrate holder.

4. The method of claim 1, further comprising the step of supplying water vapor at the substrate surface.

5. A method of claim 1, wherein the concentrated plasma of the at least one radical has a pressure and a density higher in the immediate vicinity of the surface of the substrate than the pressure and density in its surroundings within the chamber.

6. The method of claim 1, wherein forming the plasma comprises generating the plasma using a high-density plasma source.

7. The method of claim 6, wherein the high density plasma source is selected from an inductively coupled plasma source, a capacitively coupled plasma source, magnetically enhanced plasma source, or a helicon plasma source.

8. The method of claim 1, further comprising selecting the first gas to comprise at least one gas comprising at least one of fluorine or chlorine, Ar, $O_2$, or any combinations thereof and selecting the at least one processing gas introduced at the second location to comprise $NF_3$.

9. The method of claim 8, wherein the at least one gas comprising at least one of fluorine or chlorine comprises at least one of $SF_6$, $C_4F_8$, $CH_4$, or $NF_3$.

10. The method of claim 1, wherein introducing the at least one processing gas comprises providing a gas diffuser configured to direct the at least one processing gas into the second location.

11. The method of claim 10, wherein the gas diffuser comprises a diffuser ring, the diffuser ring defining the opening.

12. The method of claim 10, wherein the gas diffuser comprises a plurality of nozzles, the nozzles defining the openings.

13. A method for reactive ion etching of a ceramic substrate, the ceramic substrate defined as an inorganic, non-metallic material, including an oxide, nitride, or carbide material, the method comprising:
   forming a plasma comprising ions and electrons of a first gas remote from a surface of the ceramic substrate;
   introducing at least one processing gas different from the first gas at a location in an immediate vicinity of the surface of the ceramic substrate through a plurality of openings positioned about the periphery of the surface of the ceramic substrate;
   directing ions and electrons from the plasma of the first gas to the surface of the ceramic substrate, the ions and electrons from the plasma of the first gas interacting with the at least one processing gas to generate at least one radical of the at least one processing gas from an incomplete breakdown of the processing gas to form a concentrated plasma of the at least one radical in the immediate vicinity of the surface of the ceramic substrate, wherein the at least one radical is reactive with the surface of the ceramic substrate to perform etching of the surface; and
   etching the surface of the ceramic substrate with the radicals and by ion bombardment.

14. A method of claim 13, wherein the ceramic substrate is glass.

15. A method of claim 13, wherein the first location and the second location are located in a single chamber.

16. A method of claim 13, wherein forming the plasma comprises generating the plasma using a high-density plasma source.

17. The method of claim 13, wherein the substrate holder is a variable position substrate holder.

18. The method of claim 13, further comprising the step of supplying water vapor at the substrate surface.

19. The method of claim 13, wherein introducing the at least one processing gas comprises providing a gas diffuser configured to direct the at least one processing gas into the second location.

20. The method of claim 19, wherein the gas diffuser comprises a diffuser ring, the diffuser ring defining the openings.

21. The method of claim 19, wherein the gas diffuser comprises a plurality of nozzles, the nozzles defining the openings.

22. The method of claim 13, wherein the forming of the plasma comprises: directing the first gas into a plasma chamber; generating the plasma by exciting the first gas in the plasma chamber.

23. The method of claim 22, further comprising selecting the first gas to comprise at least one gas comprising at least one of fluorine or chlorine, Ar, $O_2$, or any combinations thereof and selecting the at least one processing gas introduced at the second location to comprise $NF_3$.

24. The method of claim 23, wherein the at least one gas comprising at least one of fluorine or chlorine comprises at least one of $SF_6$, $C_4F_8$, $CH_4$, or $NF_3$.

25. The method of claim 22, further comprising selecting the at least one other processing gas to comprise Ar and NF3.

26. A method for reactive ion etching of a substrate, the method comprising:
   forming a plasma comprising ions and electrons of a first gas at a first location remote from a surface of the substrate, the substrate being held on a substrate holder;
   introducing at least one processing gas different from the first gas at a second location in an immediate vicinity of the surface of the substrate through a plurality of openings positioned about the periphery of the surface of the substrate, the at least one processing gas including $NF_3$;

directing ions and electrons from the plasma of the first gas to the surface of the substrate, the ions and electrons from the plasma of the first gas interacting with the at least one processing gas to generate at least one radical of the at least one processing gas from an incomplete breakdown of the processing gas to form a concentrated plasma of the at least one radical in the immediate vicinity of the surface of the substrate, wherein the at least one radical is reactive with the surface of the substrate to perform etching of the surface; and etching the surface of the substrate with the radicals and by ion bombardment.

27. A method of claim 26, wherein forming the plasma comprises generating the plasma using a high-density plasma source.

28. The method of claim 26, wherein introducing the at least one processing gas comprises providing a gas diffuser configured to direct the at least one processing gas into the second location.

29. The method of claim 28, wherein the gas diffuser comprises a diffuser ring, the diffuser ring defining the openings.

30. The method of claim 26, wherein the substrate holder is a variable position substrate holder.

31. The method of claim 26, further comprising selecting the first gas to comprise at least one gas comprising at least one of fluorine or chlorine, Ar, $O_2$, or any combinations thereof.

32. The method of claim 31, further comprising selecting the at least one other processing gas to comprise Ar and NF3.

* * * * *